United States Patent [19]

Kato et al.

[11] Patent Number: 5,140,497
[45] Date of Patent: Aug. 18, 1992

[54] COMPOSITE ELECTRONIC COMPONENT AND FREQUENCY ADJUSTMENT METHOD OF THE SAME

[75] Inventors: Noboru Kato; Emiko Nogome; Hisatake Okamura; Teruhisa Tsuru; Tetsuo Taniguchi; Ken Tonegawa, all of Kyoto, Japan

[73] Assignee: Murata Manufacturing Co., Ltd., Kyoto, Japan

[21] Appl. No.: 700,712

[22] Filed: May 16, 1991

[30] Foreign Application Priority Data

May 17, 1990 [JP] Japan .................................. 2-127863

[51] Int. Cl.⁵ ...................... H01G 4/10; H01G 7/00; H01P 1/20
[52] U.S. Cl. .................................. 361/321; 29/25.42; 333/202
[58] Field of Search ............... 29/25.42; 361/320, 321; 333/197, 70, 202, 208

[56] References Cited

U.S. PATENT DOCUMENTS

| | | | |
|---|---|---|---|
| 3,947,934 | 4/1976 | Olson | 29/25.42 |
| 4,792,779 | 12/1988 | Pond et al. | 338/195 |
| 4,918,570 | 4/1990 | Okamura et al. | 361/321 |
| 5,029,043 | 7/1991 | Kitahara et al. | 361/321 |

Primary Examiner—Donald A. Griffin
Attorney, Agent, or Firm—Wegner, Cantor, Mueller & Player

[57] ABSTRACT

A composite electronic component containing at least two circuit elements including an inductor. The composite electronic component comprises a component body including a laminated body of a plurality of non-conductive layers, an inductor electrode formed between either two adjacent non-conductive layers of the laminated body, a capacitor electrode formed between another two adjacent non-conductive layers of the laminated body, two shield electrodes formed on both surfaces of the laminated body, one of the shield electrodes being opposed to the capacitor electrode to constitute a capacitor, a frequency adjusting capacitor electrode which is formed outside at least one of the shield electrodes through a non-conductive layer and has a smaller area than the capacitor electrode, and a non-conductive protect layer, formed of a non-malleable material, for covering an outer surface of the frequency adjusting capacitor electrode and is to be trimmed along with the frequency adjusting capacitor electrode for frequency adjusting; and at least two connecting electrodes including a first connecting electrode connecting the capacitor electrode to the frequency adjusting capacitor electrode and a second connecting electrode connecting the two shield electrodes to each other.

22 Claims, 9 Drawing Sheets

COMPOSITE ELECTRONIC COMPONENT AND FREQUENCY ADJUSTMENT METHOD OF THE SAME

BACKGROUND OF THE INVENTION

1) Field of the Invention

The present invention relates to a composite electronic component such as a resonator and a bandpass filter incorporating a plurality of circuit elements including an inductor thanks to its laminated structure and to a method of adjusting a resonant frequency and a center frequency in a passband of such a composite electronic component.

2) Description of the Prior Art

It is very difficult to obtain a desired frequency characteristic in an electronic component such as a resonator and a bandpass filter even if it is manufactured as designed. Therefore, in most cases, the frequency of the electronic component needs to be adjusted after being manufactured.

When the electronic component has a construction wherein independent circuit elements such as an inductor and a capacitor are soldered on a printed circuit board, its frequency can easily be adjusted by replacing the capacitor with another capacitor having a different capacity. However, in the case of a composite electronic component manufactured by laminating a plurality of electrodes, its frequency cannot be adjusted easily after being manufactured, in general. Therefore, it is necessary to construct the composite electronic component so that it allows its frequency to be adjusted easily.

The applicants of the present invention have proposed a frequency adjustment method of a resonator in Japanese Patent Application No. 1-289693. According to this method, a frequency adjusting capacitor electrode is formed on an outer surface of a resonator having a laminated structure and the frequency is adjusted by trimming the frequency adjusting capacitor electrode.

However, if the trimming is done using a laser beam or sand blast, an electrode formed of a malleable material such as Cu is extended, resulting in inaccurate trimming. Therefore, it is difficult to adjust the frequency desirably.

Especially, if the composite electronic component includes a high-frequency LC filter, more accurate trimming is necessary since slight change of the capacitor leads to great fluctuation of the frequency.

SUMMARY OF THE INVENTION

An object of the present invention, therefore, is to provide a composite electronic component whose frequency can easily be adjusted desirably.

The above object is fulfilled by a composite electronic component containing at least two circuit elements including an inductor, the composite electronic component comprising a component body including a laminated body obtained by laminating a plurality of non-conductive layers, an inductor electrode formed between either two adjacent nonconductive layers of the above laminated body, a capacitor electrode formed between another two adjacent non-conductive layers of the above laminated body, two shield electrodes formed on both surfaces of the laminated body, one of the shield electrodes being opposed to the capacitor electrode to constitute a capacitor, a frequency adjusting capacitor electrode which is formed outside at least one of the shield electrodes through a non-conductive layer and has a smaller area than the capacitor electrode, and a nonconductive protect layer, formed of a non-malleable material, for covering an outer surface of the frequency adjusting capacitor electrode and is to be trimmed along with the frequency adjusting capacitor electrode for frequency adjusting; and at least two connecting electrodes including a first connecting electrode connecting the capacitor electrode to the frequency adjusting capacitor electrode and a second connecting electrode connecting the two shield electrodes to each other.

The non-conductive protect layer may be formed of ceramic.

The frequency adjusting capacitor electrode may have a lengthy shape so that it is trimmed by the fine unit.

One end of the inductor electrode may be connected to the capacitor electrode and the other end of the inductor electrode may be connected to the shield electrodes to constitute an LC parallel resonant circuit.

The first connecting electrode may further connect one end of the inductor electrode, the capacitor electrode and the frequency adjusting capacitor electrode to one another and the second connecting electrode may further connect the other end of the inductor electrode to the shield electrodes.

Both ends of the inductor electrode may be extended to be exposed respectively on a first and second side surfaces of the component body, the first and second side surfaces being opposed to each other. The capacitor electrode and the frequency adjusting capacitor electrode may be extended to be exposed on the first side surface and the shield electrodes may be extended to be exposed on the second side surface. The first connecting electrode may be formed on the first side surface so that it covers the exposed portions on the first side surface and the second connecting electrode may be formed on the second side surface so that it covers the exposed portions on the second side surface.

In the above construction, the frequency adjusting capacitor electrode may be laminated inside the shield electrode so that a portion of the shield electrode opposed to the frequency adjusting capacitor electrode may be trimmed instead of the frequency adjusting capacitor electrode.

The above object is also fulfilled by a composite electronic component equivalently provided with a bandpass filter circuit, the composite electronic component comprising a component body including a laminated body of a plurality of non-conductive layers, a first pair of shield electrodes formed between a first non-conductive layer and a second nonconductive layer of the laminated body, a magnetically coupled pair of inductor electrodes formed between the second non-conductive layer and a third non-conductive layer of the laminated body, a first pair of capacitor electrodes formed between the third non-conductive layer and a fourth non-conductive layer of the laminated body, a second pair of shield electrodes formed between the fourth non-conductive layer and a fifth non-conductive layer of the laminated body, and a second pair of capacitor electrodes, formed between the fifth non-conductive layer and a sixth nonconductive layer of the laminated body, for adjusting a frequency, each of the second pair of capacitor electrodes having a smaller area than each of the first pair of capacitor electrodes and the sixth nonconductive layer being formed of a non-malleable material; a first connecting electrode connecting one of the first pair of capacitor electrodes, one of the second pair of capacitor electrodes and one end of one inductor electrode, the above electrodes connected to the first connecting electrode being accumulated vertically; a second connecting electrode connecting one of the first pair of shield electrodes, one of the second pair of shield electrodes and the other end of the above inductor electrode, the above electrodes connected to the second connecting electrode being accumulated vertically; a third connecting electrode connecting the other of the first pair of capacitor electrodes, the other of the second pair of capacitor electrodes and one end of the other inductor electrode; and a fourth connecting electrode connecting the other of the first pair of shield electrodes, the other of the second pair of shield electrodes and the other end of the above other inductor electrode, wherein the electrodes connected to the first and second connecting electrodes equivalently constitute a first LC resonant circuit and the electrodes connected to the third and fourth connecting electrodes equivalently constitute a second LC resonant circuit, the first LC resonant circuit and the second LC resonant circuit being magnetically coupled with each other by the pair of inductor electrodes to constitute a bandpass filter, and wherein the frequency of the bandpass filter is adjusted by trimming the second pair of capacitor electrodes along with the sixth non-conductive layer.

The composite electronic component may further comprise a fifth connecting electrode, a sixth connecting electrode, a third pair of capacitor electrodes opposed to the first pair of capacitor electrodes and provided inside the third non-conductive layer, and a fourth pair of capacitor electrodes opposed to the third pair of capacitor electrodes and provided inside the third nonconductive layer, the third pair of capacitor electrodes being connected to one of the fifth connecting electrode and the sixth connecting electrode, wherein a capacitance obtained between the third pair of capacitor electrodes and the first pair of capacitor electrodes is inserted between the fifth connecting electrode and the sixth connecting electrode, and the bandpass filter to adjust input/output impedance, and wherein a capacitance obtained between the fourth pair of capacitor electrodes and the third pair of capacitor electrodes is connected to the fifth connecting electrode and the sixth connecting electrode in parallel with the bandpass filter, thereby forming poles outside a passband.

An interval between the pair of inductor electrodes may become narrower from the ends connected to the shield electrodes to the ends connected to the capacitor electrodes in order to increase the magnetic coupling degree.

Another object of the present invention is to provide a method of adjusting a frequency of a composite electronic component having the above construction.

The above object is fulfilled by trimming the frequency adjusting capacitor electrode along with the non-conductive protect layer or by trimming the second pair of capacitor electrodes along with the sixth nonconductive layer.

According to the above construction and method, the frequency adjusting capacitor electrode is trimmed along with the non-conductive layer which is formed of a non-malleable material. As a result, the frequency adjusting capacitor electrode is prevented from being extended at the time of trimming, whichever of sand blast and a laser beam is used for trimming.

Further, if the frequency adjusting capacitor electrode has a lengthy shape so that its shorter side is to be trimmed, finer adjustment is possible. This is highly effective in a high-frequency composite electronic component.

BRIEF DESCRIPTION OF THE DRAWINGS

These and other objects, advantages and features of the invention will become apparent from the following description thereof taken in conjunction with the accompanying drawings which illustrate a specific embodiments of the invention. In the drawings.

DESCRIPTION OF THE PREFERRED EMBODIMENTS

Figure 1:
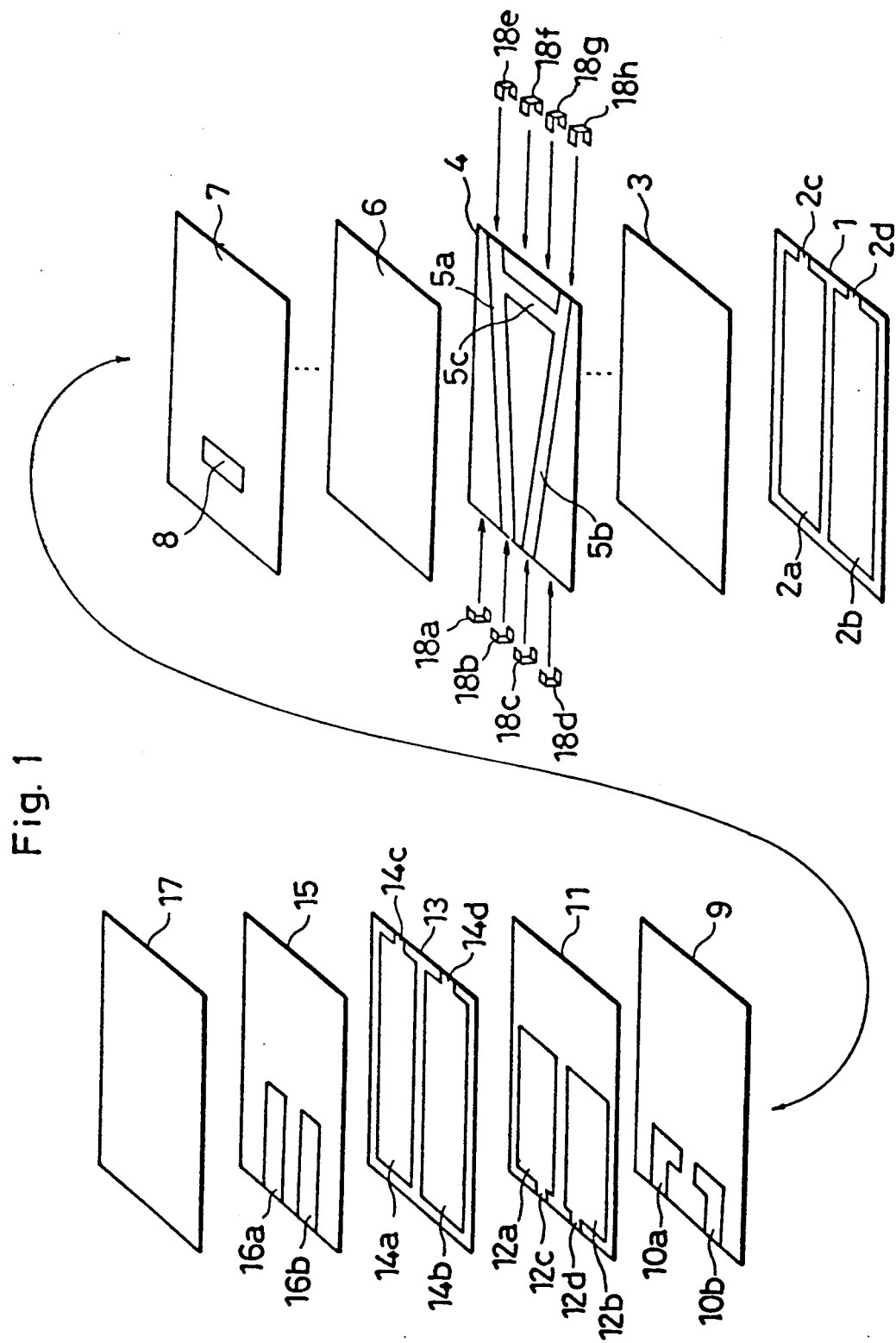
FIG. 1 is an exploded perspective view showing a bandpass filter as an embodiment of the present invention.
Figure 2:
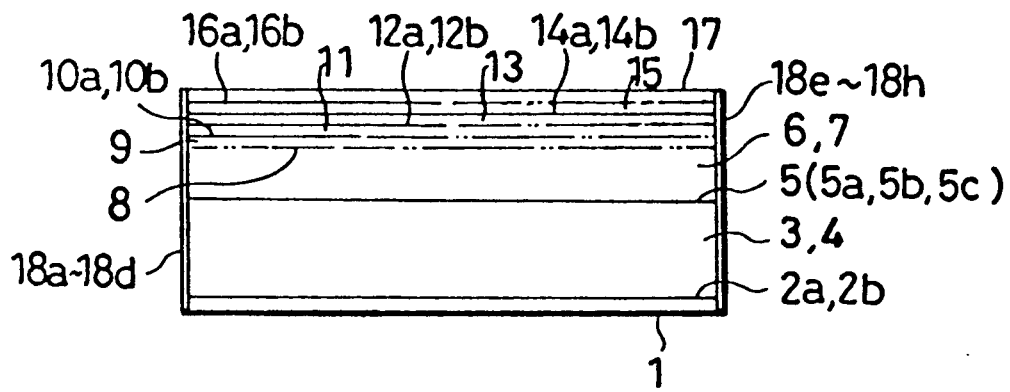
FIG. 2 is a front sectional view of FIG. 1.
Figure 3:
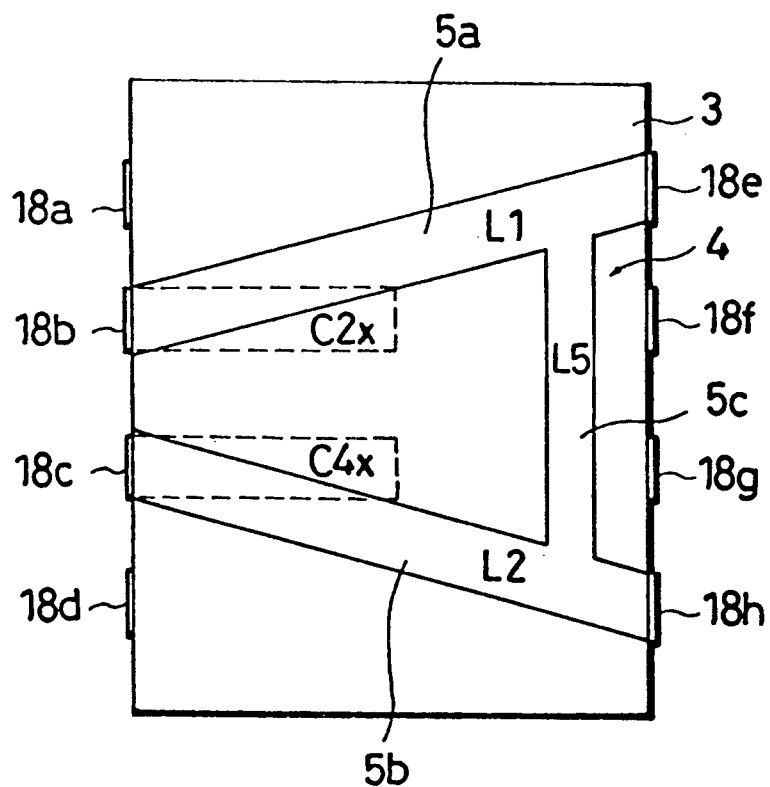
FIG. 3 is a plan view mainly showing the inductor of the bandpass filter of FIG. 1.
Figure 4:
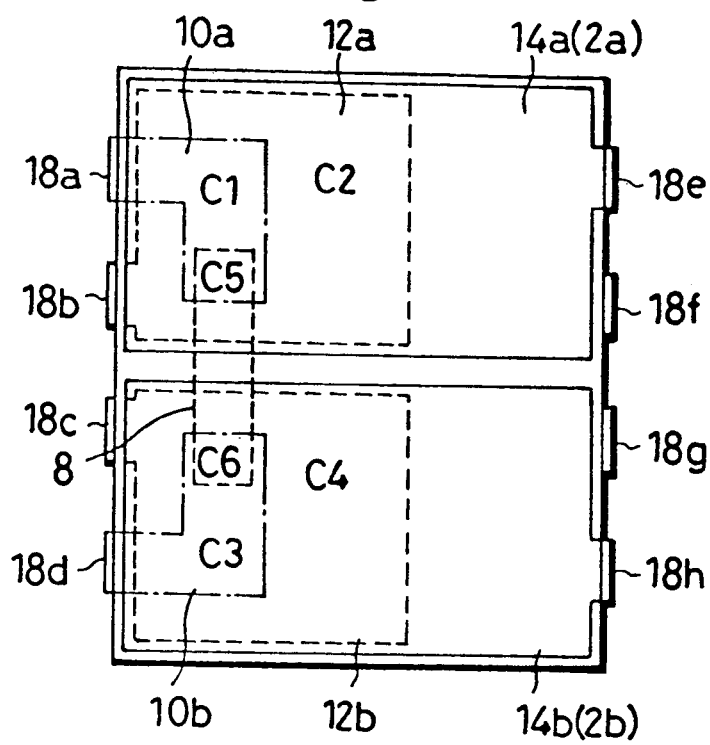
FIG. 4 is a plan view showing the capacitor of the bandpass filter of FIG. 1.

The bandpass filter shown in FIG. 1 is manufactured by laminating a plurality of unbaked green sheets (for example, dielectric sheets) to form a laminated body and firing the laminated body to obtain a bandpass filter body. Some of the above green sheets have electrode layers of conductive material printed on one surfaces thereof.

More specifically, the bandpass filter body is manufactured as follows. First, a non-conductive sheet 1 having a pair of shield electrodes 2a and 2b formed on one surface thereof, a non-conductive sheet 3 having no electrode, a non-conductive sheet 4 having a pair of inductor electrodes 5a and 5b formed on one surface thereof, a non-conductive sheet 6 having no electrode, a non-conductive sheet 7 having a pole forming capacitor electrode 8 formed on one surface thereof, a non-conductive sheet 9 having input/output impedance adjusting capacitor electrodes 10a and 10b formed on one surface thereof, a non-conductive sheet 11 having capacitor electrodes 12a and 12b formed on one surface thereof, a non-conductive sheet 13 having shield electrodes 14a and 14b formed on one surface thereof, a non-conductive sheet 15 having frequency adjusting capacitor electrodes 16a and 16b of small areas formed on one surface thereof and a non-conductive sheet 17 having no electrode are laminated in this order to form a laminated body. Then, the laminated body is pressurized and fired. The non-conductive sheets after firing process will be referred to as non-conductive layers, hereinafter.

The inductor electrodes 5a and 5b have their one ends connected to hot (input/output) terminal electrodes 18b and 18c and the other ends connected to grounding terminal electrodes 18e and 18h, respectively. The interval between the inductor electrodes 5a and 5b becomes narrower from the ends connected to the terminal electrodes 18e and 18h to the ends connected to the terminal electrodes 18b and 18c, whereby the inductor electrodes 5a and 5b are magnetically coupled with a coupling degree M. Further, portions of the inductor electrodes 5a and 5b which are adjacent to the grounding terminal electrodes 18e and 18h are connected to each other by The shield electrodes 2a, 2b, 14a and 14b respectively have lead electrodes 2c, 2d, 14c and 14d which are extended to be exposed on one side surface of the filter. The shield electrodes 2a and 14a are connected to the grounding terminal electrode 18e through the exposed portions of the lead electrodes 2c and 14c and the shield electrodes 2b and 14b are connected to the grounding terminal electrode 18h through the exposed portions of the lead electrodes 2d and 14d.

Although two pairs of shield electrodes are shown in FIG. 1, the lower pair of shield electrodes 2a and 2b may be replaced with one shield electrode if it has an area substantially equal to the sum of the areas of the shield electrodes 2a and 2b. However, the upper pair of shield electrodes 14a and 14b cannot be replaced with one shield electrode since they act as capacitor electrodes.

The capacitor electrodes 12a and 12b respectively have lead electrodes 12c and 12d which are extended in the opposite direction from the lead electrodes 2c, 2d, 14c and 14d to be exposed on the other side surface of the filter body. The capacitor electrodes 12a and 12b are respectively connected to the hot terminal electrodes 18b and 18c through the exposed portions of the lead electrodes 12c and 12d.

The capacitor electrodes 12a and 12b and the frequency adjusting capacitor electrodes 16a and 16b are opposed to each other with the shield electrodes capacitors having capacitances C2, C4, C2x and C4x. Each of the capacitances C2 and C4 is determined by a surface area where the capacitor electrode 12a or 12b is opposed to the shield electrode 14a or 14b, distance between the capacitor electrodes 12a or 12b and the shield electrode 14a or 14b and dielectric constant of the non-conductive layer between the capacitor electrode 12a or 12b and the shield electrode 14a or 14b. Each of the capacitances C2x and C4x is determined by a surface area where the frequency adjusting capacitor electrode 16a or 16b is opposed to the shield electrode 14a or 14b, distance between the frequency adjusting capacitor electrode 16a or 16b and the shield electrode 14a or 14b and dielectric constant of the non-conductive layer between the frequency adjusting capacitor electrode 16a or 16b and the shield electrode 14a or 14b. The capacitor electrode 12a and the frequency adjusting capacitor electrode 16a are connected to the hot terminal electrode 18b, the capacitor electrode 12b and the frequency adjusting capacitor electrode 16b are connected to the hot terminal electrode 18c, and the shield electrodes 14a and 14b are respectively connected to the grounding terminal electrodes 18e and 18h. Thus, a capacitor having a capacitance of C2+C2x is formed between the terminal electrodes 18b and 18e and a capacitor having a capacitance of C4+C4x is formed between the terminal electrodes 18c and 18h. Since the inductor electrode 5a is connected to the terminal electrodes 18b and 18e and the inductor electrode 5b is connected to the terminal electrodes 18c and 18h, two LC parallel resonant circuits are constituted between the terminal electrodes 18b and 18e and between the terminal electrodes 18c and 18h. Further, these LC parallel resonant circuits are magnetically coupled with each other with a coupling degree M through the inductor electrodes 5a and 5b, thereby constituting a bandpass filter.

The impedance adjusting capacitor electrodes 10a and 10b are extended in the same direction as the capacitor electrodes 12a and 12b to be exposed on the side surface of the filter body in such a manner that the exposed portions are off from the line connecting the exposed portions of the capacitor electrodes 12a and 12b. The capacitor electrodes 10a and 10b are connected to the terminal electrodes 18a and 18d. The impedance adjusting capacitor electrodes 10a and 10b are opposed to the capacitor electrodes 12a and 12b, thereby forming capacitors having capacitances C1 and C3. Since these capacitors are formed between the input/output connecting terminal electrodes and the above LC parallel resonant circuits, they serve to adjust the input/output impedance of the bandpass filter. Portions of the capacitor electrodes 10a and 10b are opposed to a capacitor electrode 8 below, thereby forming capacitors having capacitances C5 and C6 therebetween. Since these capacitors are in serial relation with the terminal electrodes 18a and 18b, they serve to form poles outside the passband of the bandpass filter.

Figure 5:
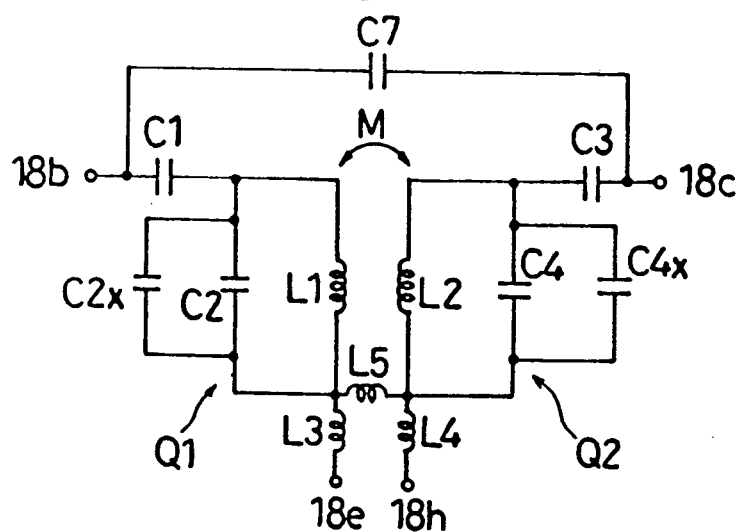
FIG. 5 is an equivalent circuit diagram of the bandpass filter of FIG. 1.

FIG. 5 is an equivalent circuit diagram of the above bandpass filter. In FIG. 5, L1, L2 and L5 indicate inductances of the inductor electrodes 5a, 5b and 5c, respectively and C7 indicates a composite capacitance of the capacitances C5 and C6. L3 indicates an inductance of the terminal electrode 18e connected to the shield electrode 14a and L4 indicates an inductance of the terminal electrode 18h connected to the shield electrode 14b.

Figure 7:
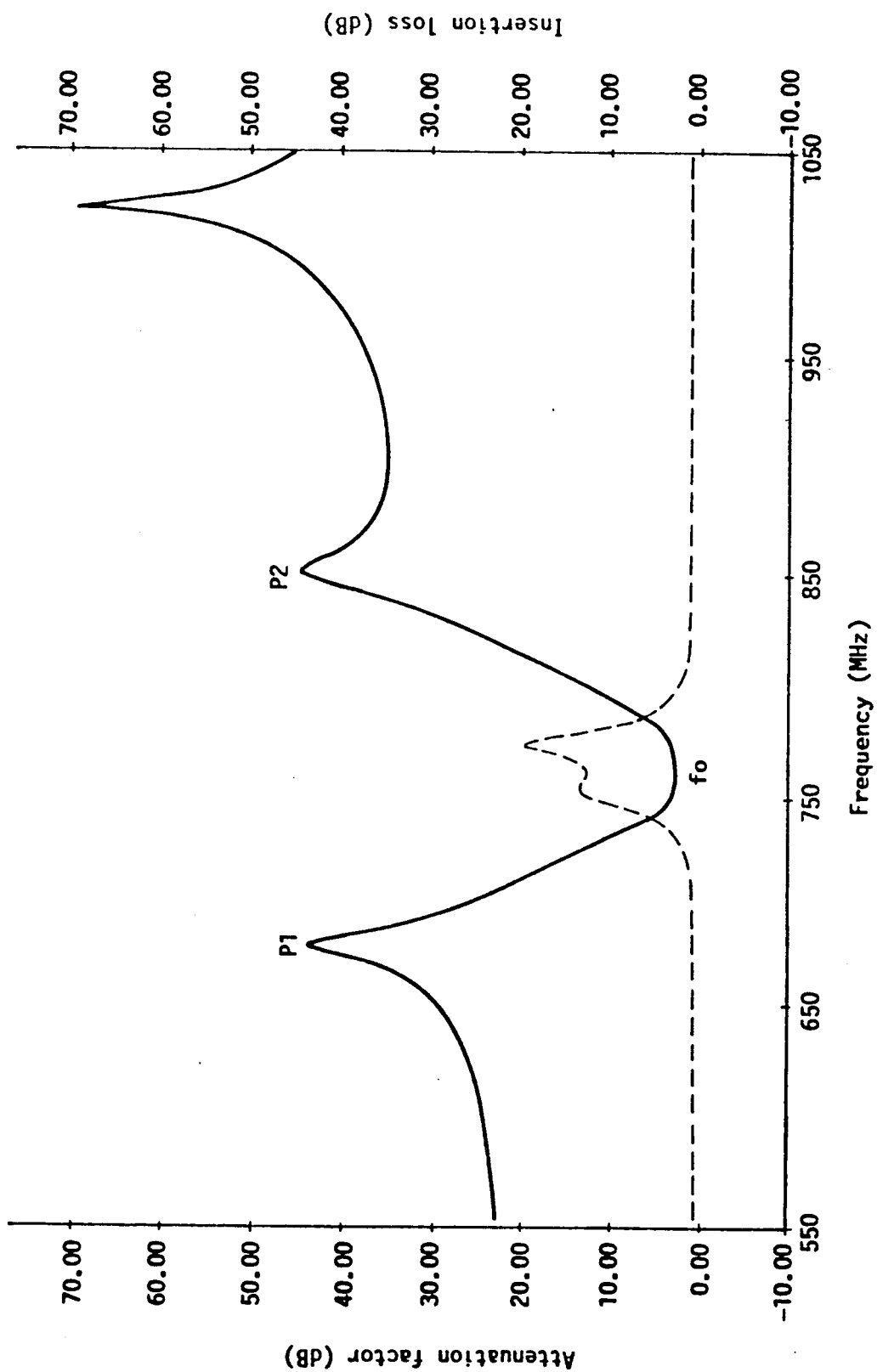
FIG. 7 is a graph showing a frequency characteristic of the bandpass filter of FIG. 1 before trimming.

FIG. 7 shows a frequency characteristic of a bandpass filter having the above construction. As seen from FIG. 7, poles P1 and P2 are formed on both sides of the center frequency f0 because of the inductance L5 and the capacitance C5. The solid line indicates attenuation factor and the broken line indicates insertion loss.

In adjusting the frequency of the above bandpass filter using a method according to the present invention, the frequency adjusting capacitor electrodes 16a and 16b are trimmed along with a protect layer 17 which is laminated thereon.

Figure 6:
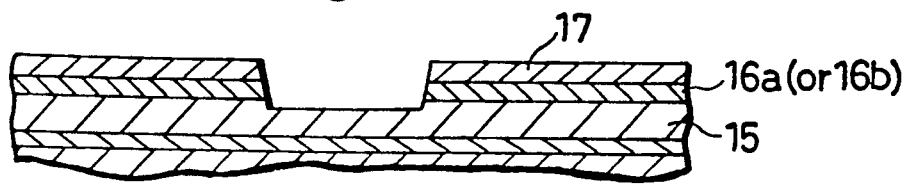
FIG. 6 is a sectional view showing a condition after trimming is done according to the present invention.

In the above method, whichever of sand blast and a laser beam is used, the frequency adjusting capacitor electrodes 16a and 16b are prevented from being extended as shown in FIG. 6 thanks to the presence of the protect layer 17 which is hard to be extended. Therefore, accurate trimming is realized.

In addition, since the frequency adjusting capacitor electrodes 16a and 16b have small areas and lengthy shape, finer adjustment is possible if the shorter sides of the electrodes 16a and 16b are trimmed. In practice, according to the present invention, the frequency can be adjusted by the unit of 1/100 against the capacitance obtained between the capacitor electrodes 12a and 12b.

Figure 8:
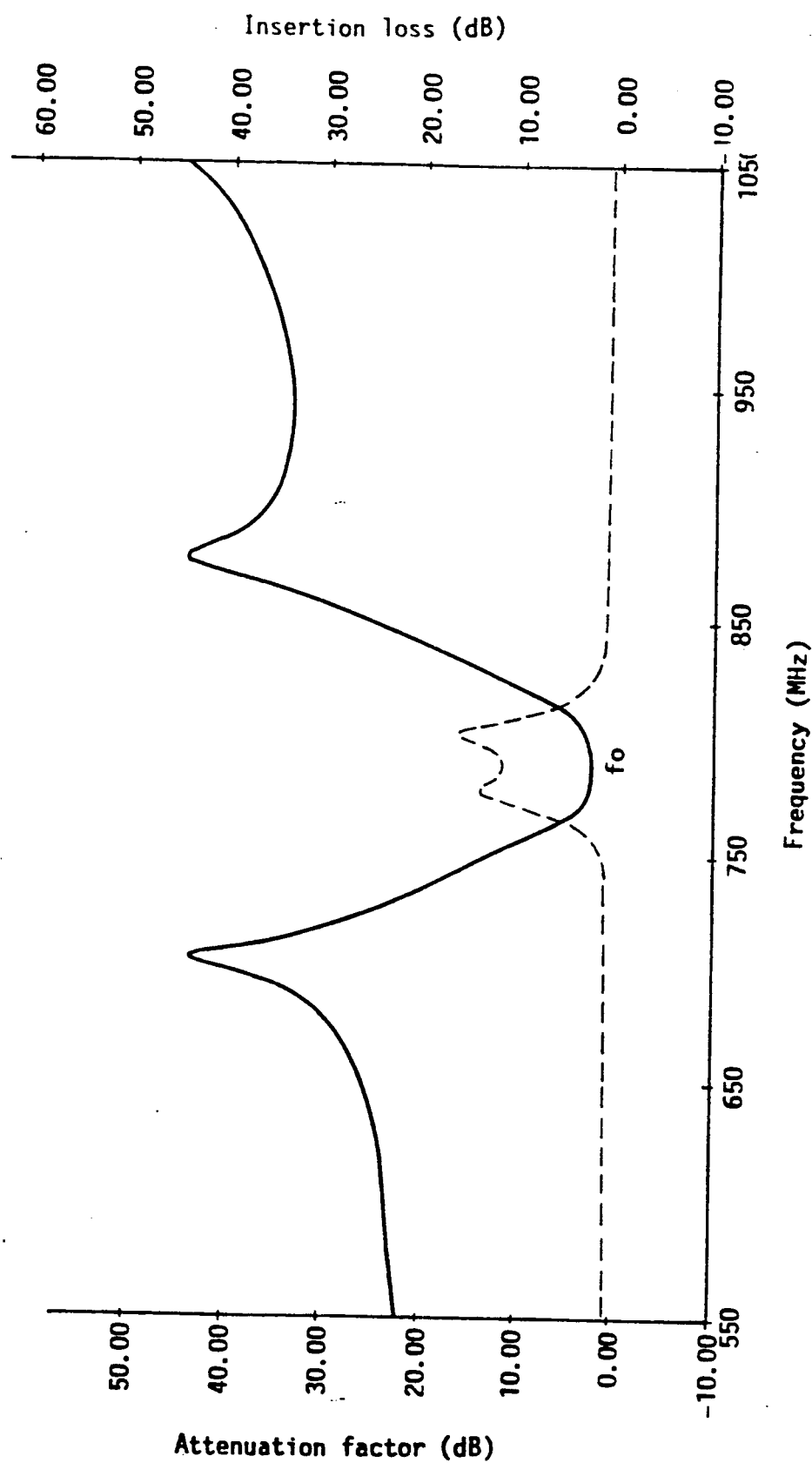
FIG. 8 is a graph showing a frequency characteristic of the bandpass filter of FIG. 1 after trimming.

FIG. 8 is a graph showing the frequency characteristic of the above bandpass filter after the whole electrodes 16a and 16b are trimmed. In FIG. 8, the solid line indicates attenuation factor and the broken line indicates insertion loss. As compared with the frequency characteristic of FIG. 7, the center frequency f0 is increased to about 26 MHz after trimming. The amount of increase of the center frequency f0 can be varied by changing areas of the electrodes 16a and 16b to be trimmed. That is, in this bandpass filter, the center frequency f0 can be adjusted accurately with the maximum center frequency at about 26 MHz.

Figure 9:
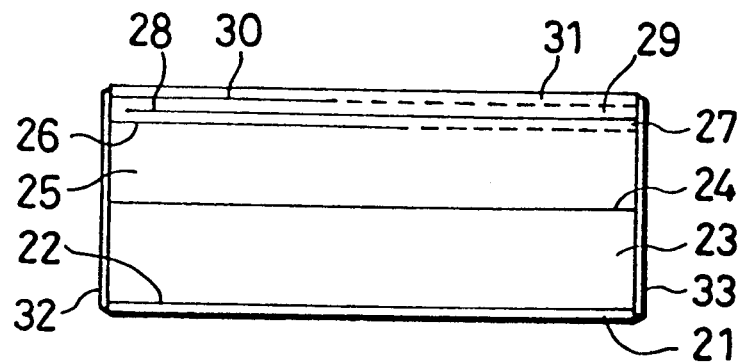
FIG. 9 is a front section view showing a resonator as another embodiment of the present invention.
Figure 10:
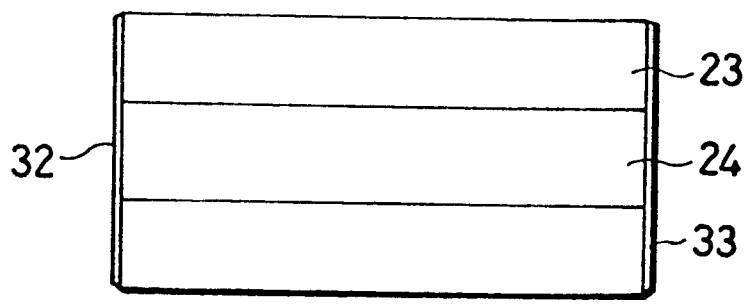
FIG. 10 is a plan view showing the inductor of the resonator of FIG. 9.
Figure 11:
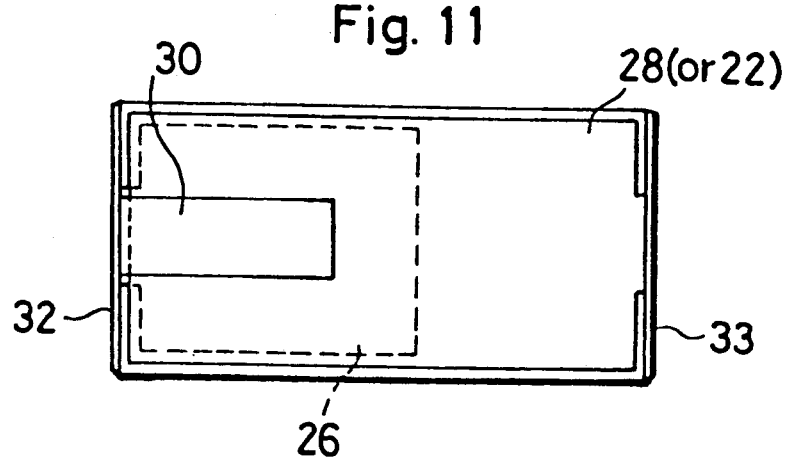
FIG. 11 is a plan view showing the capacitor of the resonator of FIG. 9.

FIG. 9 is a front section view showing another embodiment wherein the present invention is applied to a resonator. FIG. 10 is a plan view showing the inductor of the above resonator and FIG. 11 is a plan view showing the capacitor of the same. The resonator substantially has a construction obtained by dividing the bandpass filter described above into two parts. More specifically, a protect layer 21, a shield electrode 22, non-conductive layer 23, an inductor electrode 24, non-conductive layer 25, a capacitor electrode 26, non-conductive layer 27, a shield electrode 28, non-conductive layer 29, a frequency adjusting capacitor electrode 30 and a protect layer 31 are laminated in the above order to form a resonator body and two connecting terminal electrodes 32 and 33 are formed on side surfaces of the resonator body.

In this resonator also, the frequency adjusting capacitor electrode 30 is trimmed along with the protect layer 31, whereby effective and accurate trimming is realized.

Figure 12:
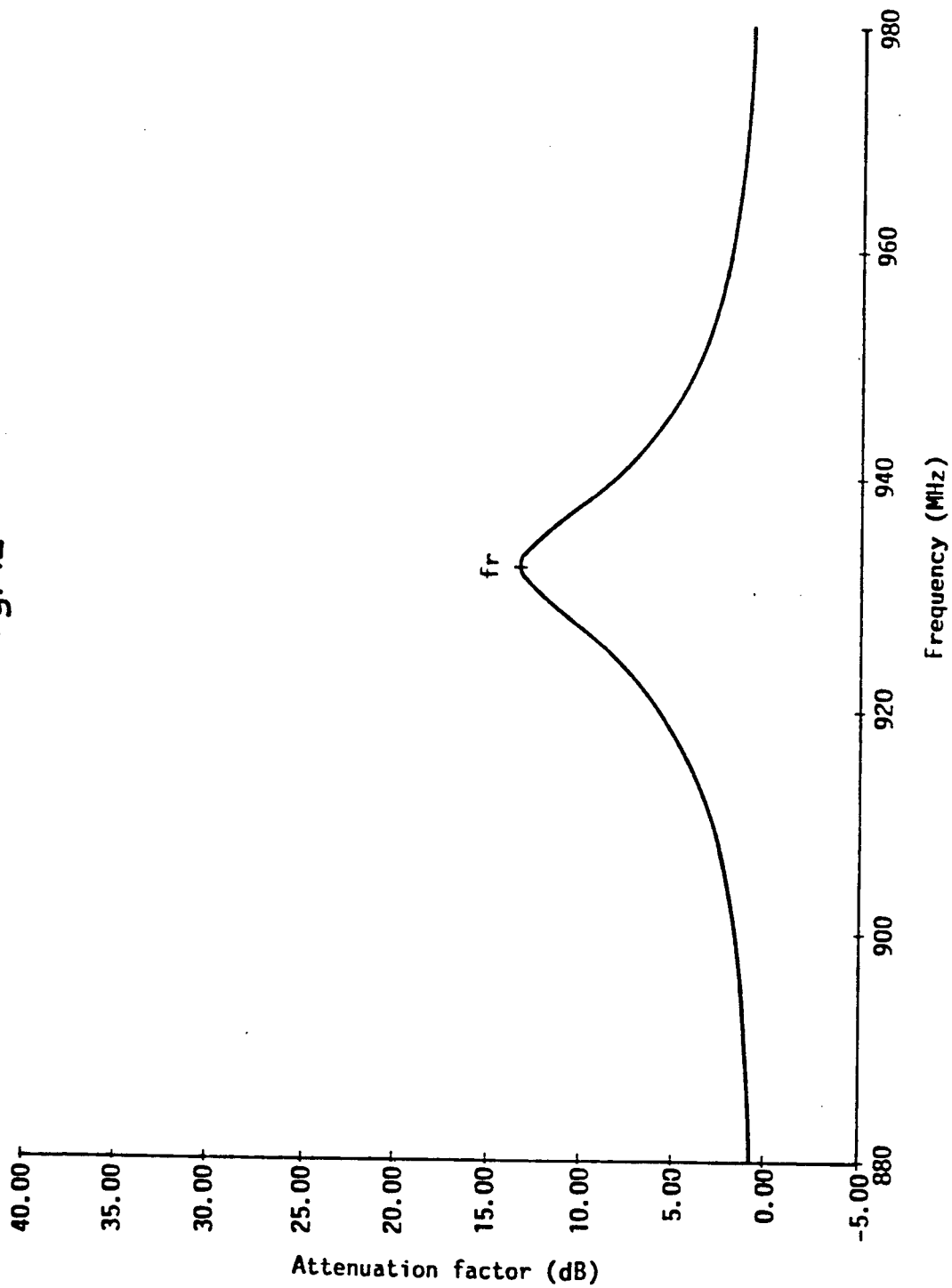
FIG. 12 is a graph showing a frequency characteristic of the resonator of FIG. 9 before trimming.
Figure 13:
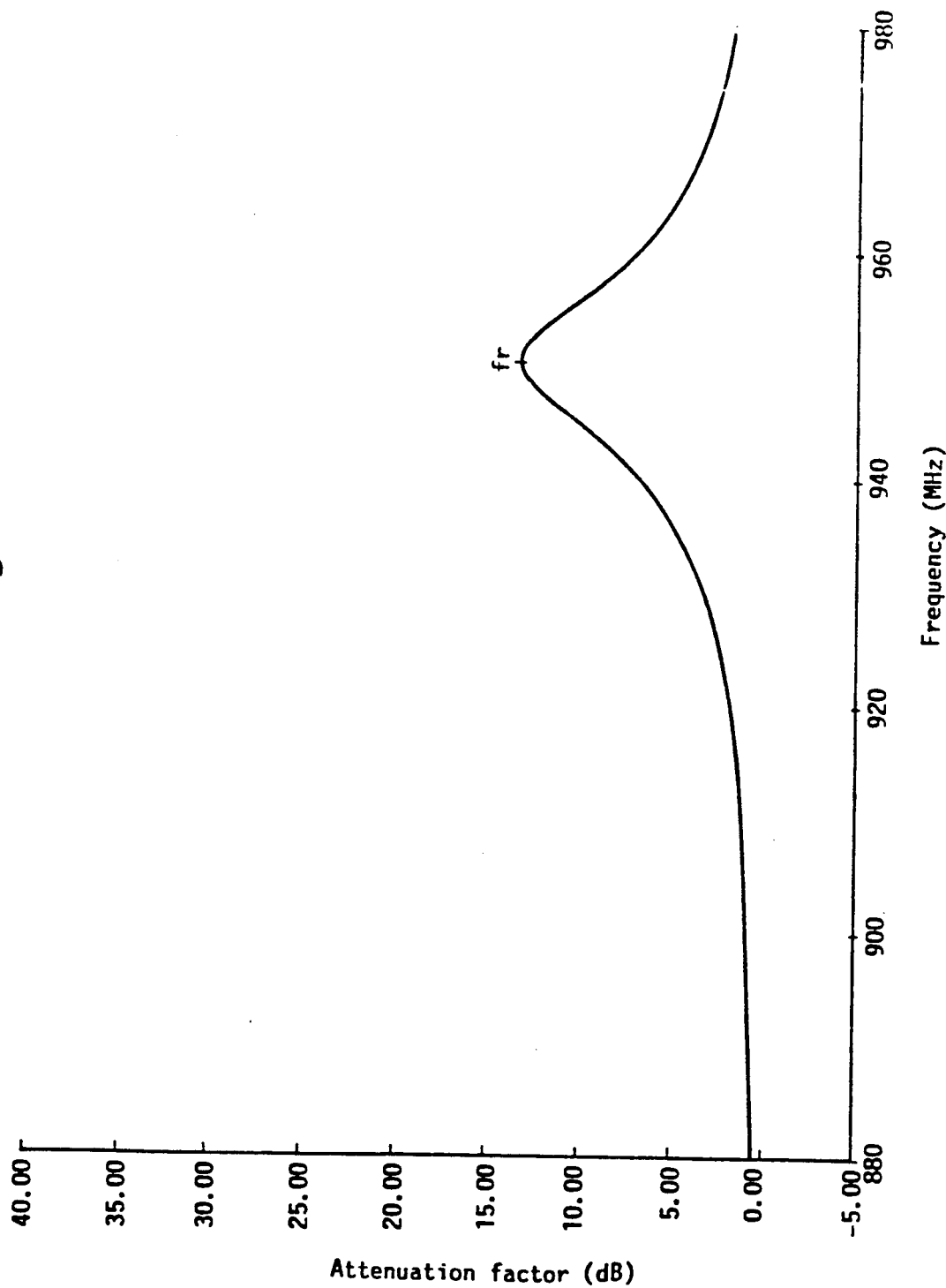
FIG. 13 is a graph showing a frequency characteristic of the bandpass filter of FIG. 9 after trimming.

As a result, the resonant frequency fr can be increased from about 932 MHz shown in FIG. 12 to a desired frequency of 950 MHz shown in FIG. 13.

In the above embodiments, the capacitor electrodes and the frequency adjusting capacitor electrodes are opposed to the same shield electrode to obtain desired capacitances. However, the present invention may be applied to a construction wherein a capacitor electrode and a frequency adjusting capacitor electrode are opposed to different shield electrodes.

Figure 14:
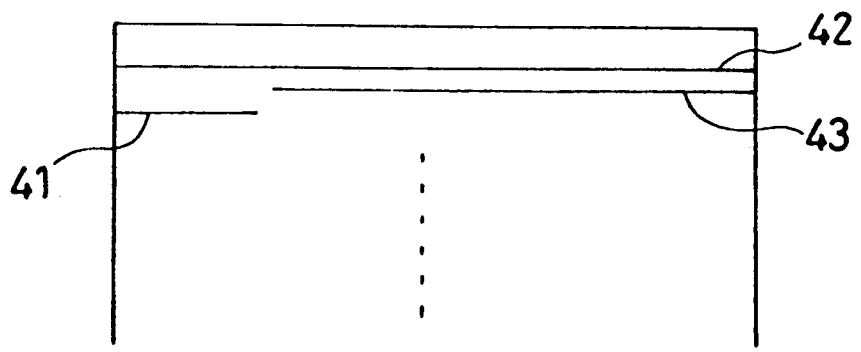
FIG. 14 is a partial sectional view showing another construction of the present invention.

Further, a portion of the shield electrode opposed to the frequency adjusting capacitor electrode may be trimmed instead of trimming the frequency adjusting capacitor electrode itself. FIG. 14 shows such a construction. In this case, a frequency adjusting capacitor electrode 41 is laminated inside a shield electrode 42 in such a manner that the frequency adjusting capacitor electrodes 41 is not opposed to a capacitor electrode 43. Trimming the shield electrode does not affects shielding function since an area to be trimmed is small.

Although the present invention has been fully described by way of examples with reference to the accompanying drawings, it is to be noted that various changes and modifications will be apparent to those skilled in the art. Therefore, unless otherwise such changes and modification depart from the scope of the present invention, they should be construed as being included therein.

What is claimed is:

1. A composite electronic component containing at least two circuit elements including an inductor, said composite electronic component comprising:
    a component body including
    a laminated body obtained by laminating a plurality of nonconductive layers,
    an inductor electrode formed between a first pair of two adjacent non-conductive layers of the above laminated body,
    a capacitor electrode formed between a second pair of adjacent non-conductive layers of the above laminated body different from said first pair,
    two shield electrodes formed on both surfaces of the laminated body, one of the shield electrodes being opposed to the capacitor electrode to constitute a capacitor,
    a frequency adjusting capacitor electrode which is formed outside at least one of the shield electrodes through a nonconductive layer and has a smaller area than the capacitor electrode, and
    a non-conductive protect layer, formed of a non-malleable material, for covering an outer surface of the frequency adjusting capacitor electrode and is to be trimmed along with the frequency adjusting capacitor electrode for frequency adjusting; and
    at least two connecting electrodes including a first connecting electrode connecting the capacitor electrode to the frequency adjusting capacitor electrode and a second connecting electrode connecting the two shield electrodes to each other.

2. A composite electronic component as claimed in claim 1, the non-conductive protect layer is formed of ceramic.

3. A composite electronic component as claimed in claim 2, wherein the frequency adjusting capacitor electrode has a lengthy shape so that it is trimmed by a fine unit.

4. A composite electronic component as claimed in claim 3, wherein one end of the inductor electrode is connected to the capacitor electrode and the other end of the inductor electrode is connected to the shield electrodes to constitute an LC parallel resonant circuit.

5. A composite electronic component as claimed in claim 4, the first connecting electrode further connects one end of the inductor electrode, the capacitor electrode and the frequency adjusting capacitor electrode to one another and the second connecting electrode further connects the other end of the inductor electrode to the shield electrodes.

6. A composite electronic component as claimed in claim 5, wherein both ends of the inductor electrode are extended to be exposed respectively on a first and second side surfaces of said component body, the first and second side surfaces being opposed to each other, wherein the capacitor electrode and the frequency adjusting capacitor electrode are extended to be exposed on the first side surface, wherein the shield electrodes are extended to be exposed on the second side surface, and wherein the first connecting electrode is formed on the first side surface so that it covers the exposed portions on the first side surface and the second connecting electrode is formed on the second side surface so that it covers the exposed portions on the second side surface.

7. A method of adjusting the frequency of a composite electronic component comprising:
    a component body including
    a laminated body obtained by laminating a plurality of non-conductive layers,
    an inductor electrode formed between a first pair of adjacent non-conductive layers of the above laminated body,
    a capacitor electrode formed between a second pair of adjacent non-conductive layers of the above laminated body different from said first pair, two shield electrodes formed on both surfaces of the laminated body, a frequency adjusting capacitor electrode which is formed outside at least one of the shield electrodes through a non-conductive layer and has a smaller area than the capacitor electrode, and a non-conductive protect layer, formed of a non-malleable material, for covering an outer surface of the frequency adjusting capacitor electrode;

wherein the capacitor electrode and the frequency adjusting capacitor electrode are electrically connected to each other, whereby a first capacitor obtained between the capacitor electrode and the shield electrode opposed thereto and a second capacitor obtained between either one of the shield electrodes and the frequency adjusting capacitor electrode are electrically connected in parallel, and wherein one end of the inductor electrode is connected to the capacitor electrode and the other end of the inductor electrode is connected to the shield electrodes, said method comprising a step of trimming the frequency adjusting capacitor electrode along with the non-conductive protect layer.

8. A method of adjusting the frequency of a composite electronic component as claimed in claim 7, wherein said trimming is effected along the shorter side of the frequency adjusting capacitor electrode.

9. A composite electronic component containing at least two circuit elements including an inductor, said composite electronic component comprising:

a component body including a laminated body obtained by laminating a plurality of non-conductive layers, an inductor electrode formed between a first pair of adjacent non-conductive layers of the above laminated body, a capacitor electrode formed between a second pair of adjacent non-conductive layers of the above laminated body different from said first pair, a second capacitor electrode, formed between either two adjacent non-conductive layers of the above laminated body, for adjusting the frequency, the second capacitor electrode having a smaller area than the first capacitor electrode, two shield electrodes respectively formed on both surfaces of the laminated body, and a non-conductive protect layer, formed of a non-malleable layer, for covering an outer surface of at least one of the shield electrodes; and at least two connecting electrodes including a first connecting electrode connecting the first capacitor electrode to the second capacitor electrode and a second connecting electrode connecting the two shield electrodes to each other, wherein the first capacitor electrode is opposed to one shield electrode to constitute a first capacitor therebetween and the second capacitor electrode is opposed to the other shield electrode to constitute a second capacitor therebetween, and wherein a portion of the above other shield electrode opposed to the second capacitor electrode has an area which is to be trimmed with the non-conductive layer for frequency adjusting.

10. A composite electronic component as claimed in claim 9, the non-conductive protect layer is formed of ceramic.

11. A composite electronic component as claimed in claim 10, wherein the first capacitor electrode and the second capacitor electrode are provided in such a manner that they are opposed to the same shield electrode without being opposed to each other.

12. A method of adjusting the frequency of a composite electronic component comprising:

a component body including a laminated body obtained by laminating a plurality of non-conductive layers, an inductor electrode formed between either two adjacent non-conductive layers of the above laminated body, a first capacitor electrode formed between another two adjacent non-conductive layers of the above laminated body, a second capacitor electrode formed between either two adjacent non-conductive layers of the above laminated body, the second capacitor electrode having a smaller area than the first capacitor electrode, two shield electrodes formed on both surfaces of the laminated body, and a non-conductive protect layer, formed of a non-malleable material, for covering an outer surface of at least one of the shield electrodes; and at least two connecting electrodes including a first connecting electrode connecting the first capacitor electrode to the second capacitor electrode and a second connecting electrode connecting the two shield electrodes to each other, said method comprising a step of trimming a portion of the shield electrode opposed to the second capacitor electrode along with the non-conductive protect layer.

13. A composite electronic component equivalently provided with a bandpass filter circuit, said composite electronic component comprising:

a component body including a laminated body of a plurality of non-conductive layers, a first pair of shield electrodes formed between a first non-conductive layer and a second nonconductive layer of the laminated body, a magnetically coupled pair of inductor electrodes formed between the second non-conductive layer and a third non-conductive layer of the laminated body, a first pair of capacitor electrodes formed between the third non-conductive layer and a fourth non-conductive layer of the laminated body, a second pair of shield electrodes formed between the fourth non-conductive layer and a fifth nonconductive layer of the laminated body, and a second pair of capacitor electrodes, formed between the fifth non-conductive layer and a sixth non-conductive layer of the laminated body, for adjusting a frequency, each of the second pair of capacitor electrodes having a smaller area than each of the first pair of capacitor electrodes and the sixth non-conductive layer being formed of a non-malleable material;

a first connecting electrode connecting one of the first pair of capacitor electrodes, one of the second pair of capacitor electrodes and one end of one inductor electrode, the above electrodes connected to the first connecting electrode being accumulated vertically;

a second connecting electrode connecting one of the first pair of shield electrodes, one of the second pair of shield electrodes and the other end of the above inductor electrode, the above electrodes connected to the second connecting electrode being accumulated vertically;

a third connecting electrode connecting the other of the first pair of capacitor electrodes, the other of the second pair of capacitor electrodes and one end of the other inductor electrode; and a fourth connecting electrode connecting the other of the first pair of shield electrodes, the other of the second pair of shield electrodes and the other end of the above other inductor electrode, wherein the electrodes connected to said first and second connecting electrodes equivalently constitute a first LC resonant circuit and the electrodes connected to said third and fourth connecting electrodes equivalently constitute a second LC resonant circuit, said first LC resonant circuit and said second LC resonant circuit being magnetically coupled with each other by the pair of inductor electrodes to constitute a bandpass filter, and wherein the frequency of said bandpass filter is adjusted by trimming the second pair of capacitor electrodes along with the sixth non-conductive layer.

14. A composite electronic component as claimed in claim 13, the sixth non-conductive layer is formed of ceramic.

15. A composite electronic component as claimed in claim 14, wherein each of the second pair of capacitor electrodes has a lengthy shape so that it is trimmed by a fine unit.

16. A composite electronic component as claimed in claim 15, further comprising a fifth connecting electrode, a sixth connecting electrode, a third pair of capacitor electrodes opposed to the first pair of capacitor electrodes and provided inside the third non-conductive layer, and a fourth pair of capacitor electrodes opposed to the third pair of capacitor electrodes and provided inside the third nonconductive layer, the third pair of capacitor electrodes being connected to one of the fifth connecting electrode and the sixth connecting electrode, wherein a capacitance obtained between the third pair of capacitor electrodes and the first pair of capacitor electrodes is inserted between the fifth connecting electrode and the sixth connecting electrode, and the bandpass filter to adjust input/output impedance, and wherein a capacitance obtained between the fourth pair of capacitor electrodes and the third pair of capacitor electrodes is connected to the fifth connecting electrode and the sixth connecting electrode in parallel with the bandpass filter, thereby forming poles outside a passband.

17. A composite electronic component as claimed in claim 16, wherein a portion of one inductor electrode and a portion of the other inductor electrode are connected to each other by another inductor electrode near the ends thereof connected to the shield electrodes.

18. A composite electronic component as claimed in claim 17, wherein an interval between the pair of inductor electrodes becomes narrower from the ends connected to the shield electrodes to the ends connected to the capacitor electrodes, thereby increasing the magnetic coupling degree.

19. A method of adjusting the frequency of a composite electronic component equivalently provided with a bandpass filter circuit, said composite electronic component comprising:

a component body including a laminated body of a plurality of non-conductive layers, a fist pair of shield electrodes formed between a first non-conductive layer and a second nonconductive layer of the laminated body, a magnetically coupled pair of inductor electrodes formed between the second non-conductive layer and a third non-conductive layer of the laminated body, a first pair of capacitor electrodes formed between the third non-conductive layer and a fourth non-conductive layer of the laminated body, a second pair of shield electrodes formed between the fourth non-conductive layer and a fifth nonconductive layer of the laminated body, and a second pair of capacitor electrodes, formed between the fifth non-conductive layer and a sixth non-conductive layer of the laminated body, for adjusting a frequency, each of the second pair of capacitor electrodes having a smaller area than each of the first pair of capacitor electrodes and the sixth non-conductive layer being formed of a non-malleable material;

a first connecting electrode connecting one of the first pair of capacitor electrodes, one of the second pair of capacitor electrodes and one end of one inductor electrodes, the above electrodes connected to the first connecting electrode being accumulated vertically;

a second connecting electrode connecting one of the first pair of shield electrodes, one of the second pair of shield electrodes and the other end of the above inductor electrode, the above electrodes connected to the second connecting electrode being accumulated vertically;

a third connecting electrode connecting the other of the first pair of capacitor electrodes, the other of the second pair of capacitor electrodes and one end of the other inductor electrode; and a fourth connecting electrode connecting the other of the first pair of shield electrodes, the other of the second pair of shield electrodes and the other end of the above other inductor electrode, said method comprising a step of trimming the second pair of capacitor electrodes along with the sixth non-conductive layer.

20. A method of adjusting the frequency of a composite electronic component as claimed in claim 19, wherein said trimming is effected along a shorter side of each of the second pair of capacitor electrodes.

21. A method of adjusting the frequency of a composite electronic component as claimed in claim 20, wherein said composite electronic component further comprises a fifth connecting electrode, a sixth connecting electrode, a third pair of capacitor electrodes opposed to the first pair of capacitor electrodes and provided inside the third non-conductive layer and a fourth pair of capacitor electrodes opposed to the third pair of capacitor electrodes and provided inside the third non-conductive layer, the third pair of capacitor electrodes being connected to one of the fifth connecting electrode and the sixth connecting electrode, wherein a capacitance obtained between the third pair of capacitor electrodes and the first pair of capacitor electrodes is inserted between the fifth connecting electrode and the sixth connecting electrode, and the bandpass filter to adjust input/output impedance, and wherein a capacitance obtained between the fourth pair of capacitor electrodes and the third pair of capacitor electrodes is connected to the fifth connecting electrode and the sixth connecting electrode in parallel with the bandpass filter, thereby forming poles outside a passband.

22. A method of adjusting the frequency of a composite electronic component as claimed in claim 21, wherein a portion of one inductor electrode and a portion of the other inductor electrode are connected to each other by another inductor electrode near the ends thereof connected to the shield electrodes.

* * * * *